(12) United States Patent
Ali

(10) Patent No.: US 6,765,517 B1
(45) Date of Patent: Jul. 20, 2004

(54) VARIABLE ORDER SIGMA-DELTA MODULATOR

(75) Inventor: Danish Ali, Croydon (GB)

(73) Assignee: U.S. Philips Corporation, New York, NY (US)

( * ) Notice: Subject to any disclaimer, the term of this patent is extended or adjusted under 35 U.S.C. 154(b) by 324 days.

(21) Appl. No.: 09/616,634

(22) Filed: Jul. 26, 2000

(30) Foreign Application Priority Data

Jul. 28, 1999 (GB) ............................................. 9917567

(51) Int. Cl.[7] ............................ H03M 1/10; H03M 3/00
(52) U.S. Cl. ..................................... 341/143; 341/120
(58) Field of Search ................................. 341/143, 110, 341/118, 120, 172, 141, 139; 327/105, 113

(56) References Cited

U.S. PATENT DOCUMENTS

| | | | |
|---|---|---|---|
| 5,012,244 A | | 4/1991 | Wellard et al. |
| 5,055,843 A | | 10/1991 | Ferguson, Jr. |
| 5,986,598 A | * | 11/1999 | Mittel .......................... 341/143 |
| 6,037,887 A | * | 3/2000 | Wu et al. ..................... 341/143 |
| 6,157,331 A | * | 12/2000 | Liu et al. ..................... 341/143 |
| 6,218,972 B1 | * | 4/2001 | Groshong .................... 341/143 |

FOREIGN PATENT DOCUMENTS

| | | |
|---|---|---|
| EP | 0501580 A1 | 9/1992 |
| EP | 0512687 A2 | 11/1992 |

* cited by examiner

Primary Examiner—Patrick Wamsley
(74) Attorney, Agent, or Firm—Theodorus N. Mak

(57) ABSTRACT

A Sigma-Delta modulator(10) comprises a signal put(34) coupled to a forward filter comprising a series connection of a plurality of N summing stages(28, 30, 32), where N is an integer of at least 2, alternating with a corresponding plurality of integrating stages(40, 42, 44) and an analogue to digital converter(ADC)(18) having an input coupled to an output of the Nth integrating stage(44) and an output. A feedback filter comprises a feedback coupling from the output of the ADC(18) to a digital to analogue converter (DAC)(26) which is coupled to an input of each of the summing stages by way of respective weights(46, 48, 50). Control means(66) including switching means (58, 64) are provided for changing the order of the modulator. To reduce the order and increase the bandwidth, the control means by-passes the first(40) of the integrating stages and uses the second(42) of the integrating stages as a first of the integrating stages and vice versa to increase the order and decrease the bandwidth.

10 Claims, 3 Drawing Sheets

VARIABLE ORDER SIGMA-DELTA MODULATOR

Figure 1:
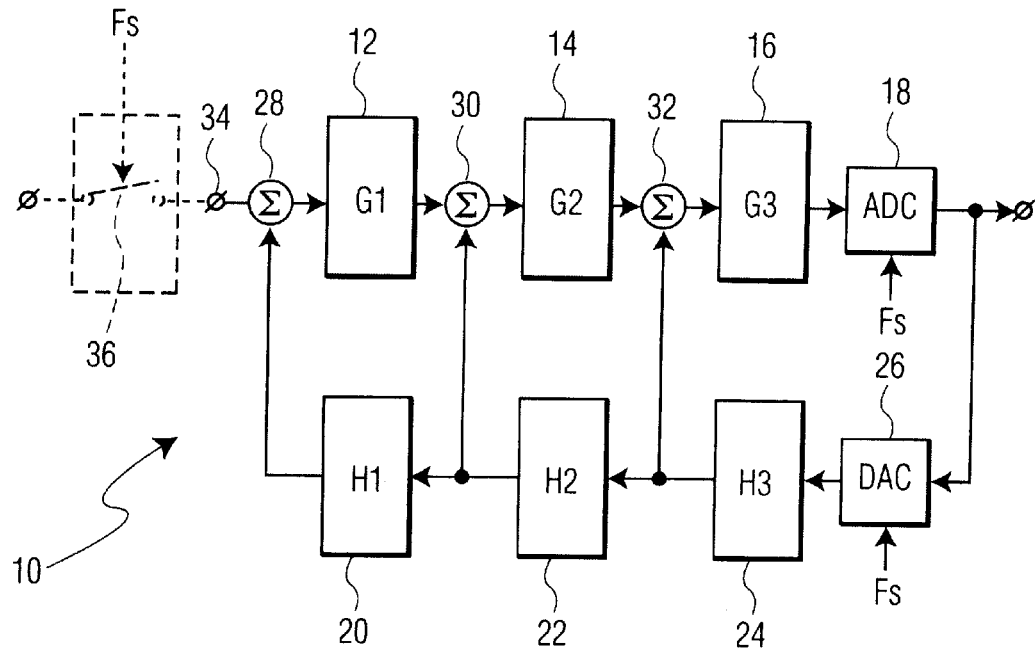

The present invention relates to a variable Sigma-Delta modulator which is usable in a receiver for receiving relatively narrowband cellular telephone signals, such as GSM, and relatively wideband cellular telephone signals, such as IS95.

A stable, high order Sigma-Delta modulator is disclosed in EP-A1-0 501 580. The modulator comprises an Nth order low pass filter which is constituted by a series combination of N first-order integrating sections with the output of one section being connected to the input of the next section. Each integrating section comprises an integrator connected in series with a limiter. The individual output signals are tapped-off and weighted by respective weighting amplifiers and added together in a summing stage coupled between the output of the Nth section and the input to an analogue to digital converter (ADC) which is sampled at a fixed rate. An output of the ADC is fed back and subtracted from an input signal, the difference signal being applied to the first section. The gains of the integrating sections and the limiting values of the limiters are selected so that the last or Nth limiter in the series arrangement is activated first when the level in the Sigma-Delta modulator increases, subsequently the last but one or (N−1)th limiter is activated and so on. This reduces the order level of the filter system each time by one when there is an increasing signal level, and causes the Sigma-Delta modulator to remain stable.

It is an object to provide a Sigma-Delta modulator which is adaptable to operate in accordance with telecommunications standards requiring widely differing bandwidths.

According to a first aspect of the present invention there is provided a Sigma-Delta modulator comprising a signal input, a plurality of N integrating stages, where N is an integer of at least 2, a corresponding plurality of summing stages coupled to an input of a respective one of the integrating stages, an output of the first to the (N−1)th summing stages being coupled to an input of the second to the Nth integrating stage, respectively, an analogue to digital converter(ADC) having an input coupled to an output of the Nth integrating stage and an output, a feedback coupling from the ADC to a digital to analogue converter(DAC) which is coupled to an input of each of the summing stages, means for sampling the ADC and DAC, and control means for changing the order of the modulator, said control means comprising means for disconnecting the first of the integrating stages and using the second of the integrating stages as a first of the integrating stages.

According to a second aspect of the present invention there is provided a receiver comprising means for frequency down converting an input signal to an IF signal, bandpass filtering means and a Sigma-Delta modulator comprising a signal input, a plurality of N integrating stages, where N is an integer of at least 2, a corresponding plurality of summing stages coupled to an input of a respective one of the integrating stages, an output of the first to the (N−1)th summing stages being coupled to an input of the second to the Nth integrating stage, respectively, an analogue to digital converter(ADC) having an input coupled to an output of the Nth integrating stage and an output, a feedback coupling from the ADC to a digital to analogue converter(DAC) which is coupled to an input of each of the summing stages, means for sampling the ADC and DAC, and control means for changing the order of the modulator, said control means comprising means for disconnecting the first of the integrating stages and using the second of the integrating stages as a first of the integrating stages.

In one arrangement of the Sigma-Delta modulator made in accordance with the present invention the control means reduces the order of the modulator by disconnecting the first integrating stage from the second summing stage and connecting the signal input to the second summing stage.

In another arrangement of the Sigma-Delta modulator made in accordance with the present invention the control means reduces the order of the modulator by switching the signal input to the second integrating stage to the output of the first summing stage. The sampling rate of the ADC and DAC can be increased thus increasing the bandwidth of the modulator. This particular arrangement and its manner of operation enables the Sigma-Delta modulator to be converted from a higher order, lower bandwidth configuration suitable for use with GSM to a lower order, higher bandwidth configuration suitable for use with IS95.

In reconfiguring the Sigma-Delta modulator made in accordance with the present invention the objective is to enable the product of the dynamic range and the bandwidth appropriate to the specified requirements.

An advantage of reconfiguring the Sigma-Delta modulator by disconnecting/reconnecting the first integrating stage is that significant amounts of power can be saved. This does not impact on the dynamic range because the quantisation noise is higher for a lower order modulator enabling as a result a greater amount of electronic noise to be tolerated.

Figure 2:
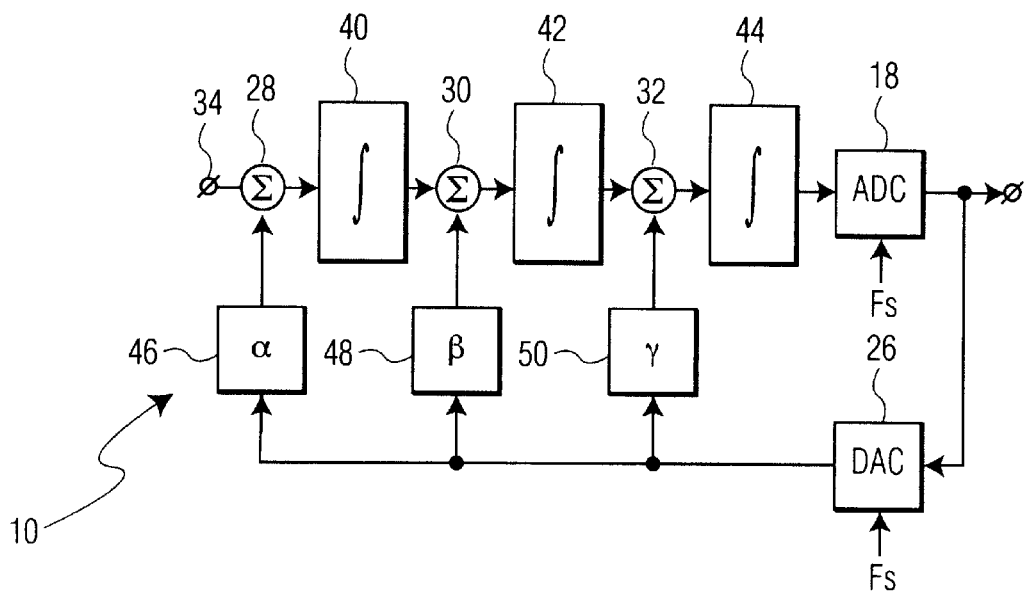
Figure 3:
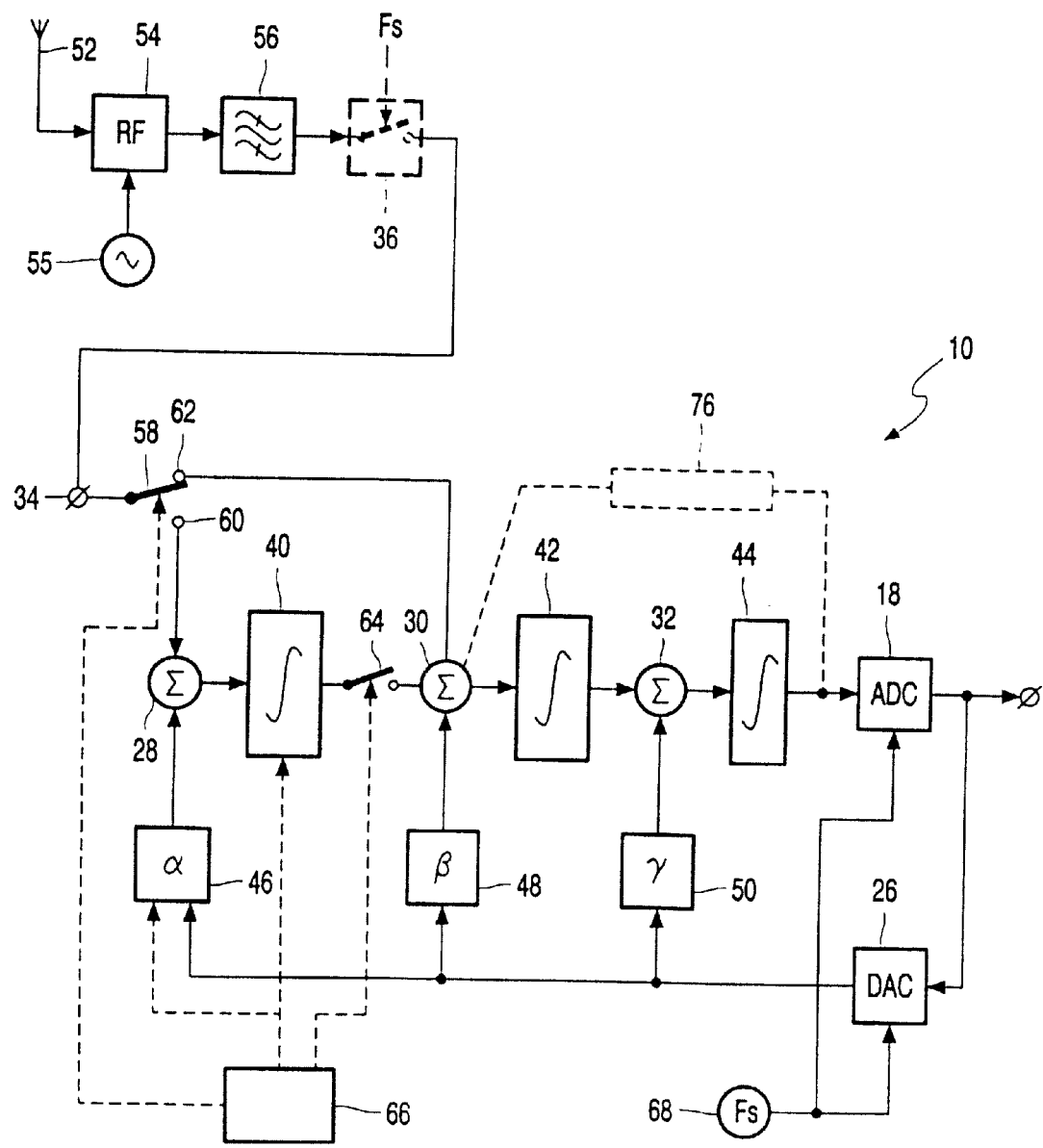
Figure 4:
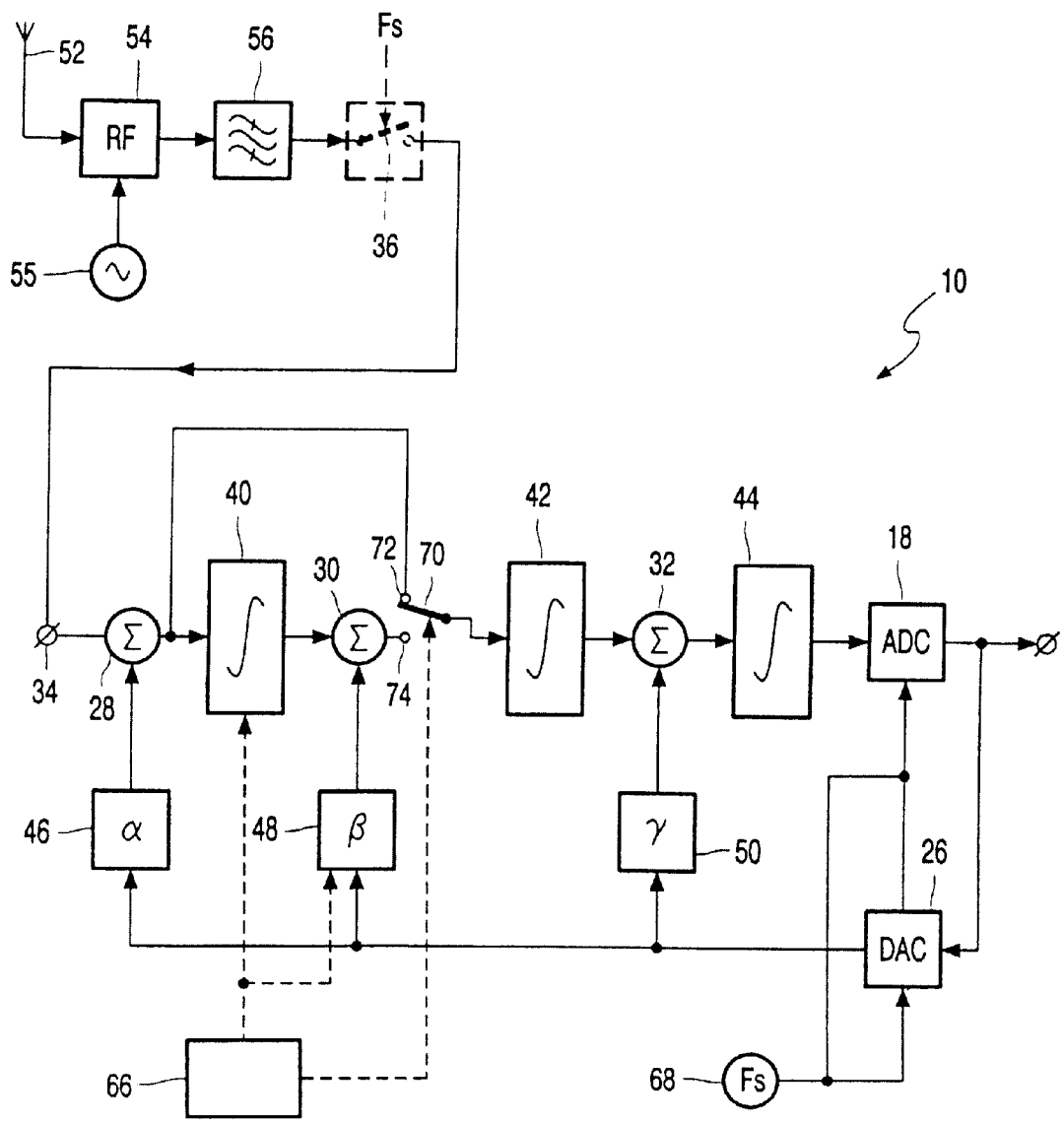

The present invention will now be explained and described, by way of example, with reference to the accompanying drawings, wherein:

FIG. 1 is a block schematic diagram of a known type of time continuous 3rd order Sigma-Delta modulator having a distributed feedback filter function H(z) in the feedback path, FIG. 2 is a block schematic diagram of a variant of the Sigma-Delta modulator shown in FIG. 1 having integrating stages and distributed feedback elements in the form of capacitors, FIG. 3 is a simplified block schematic diagram of a receiver including one embodiment of a time continuous Sigma-Delta modulator made in accordance with the present invention, and FIG. 4 is a simplified block schematic diagram of a receiver including a second embodiment of a time continuous Sigma-Delta modulator made in accordance with the present invention.

In the drawings the same reference numerals have been used to identify corresponding features.

The 3rd order time continuous Sigma-Delta modulator shown in FIG. 1 is based on that disclosed by Ferguson et al in U.S. Pat. No. 5,055,843.

In summary this prior specification discloses a modulator having a forward filter function G(z) coupled to an ADC and a feedback path having a DAC and a feedback filter function H(z).

FIG. 1 of the accompanying drawings shows a Sigma-Delta modulator 10 in which the forward filter function is divided into three discrete functions G1, G2 and G3 comprising series coupled circuit stages 12, 14, 16, the output of the final stage 16 being connected to an ADC 18. The feedback filter function is divided into three discrete functions H1, H2 and H3 comprising series coupled circuit stages 20, 22, 24. A DAC 26 has an input coupled to an output of the ADC 18 and an output coupled to an input of the circuit stage 24. Summation stages 28, 30 and 32 are respectively connected between a signal input 34 and an input to the circuit stage 12, between the output of the circuit stage 12 and the input to the circuit stage 14, and between the output of the circuit stage 14 and the input of the circuit stage 16. The summation stages 28, 30 and 32 have a second input coupled respectively to the outputs of the circuit stages 20, 22, 24. By having this distributed arrangement the input of each forward filter circuit stage 12, 14, 16 is directly under the control of a corresponding feedback signal from the circuit stage 20, 22, 24, respectively.

The illustrated circuit can be made into a time discrete Sigma-Delta modulator by connecting a sampling switch 36 to the signal input 34 and clocking the switch 36 at the same rate, Fs, as the ADC 18 and DAC 26. If it is desired to change the order from 3rd order then other summation, feed forward and feedback stages can be added or removed as required.

FIG. 2 shows a variant of FIG. 1 in which the forward filter functions 12, 14 and 16 (FIG. 1) are implemented as integrators 40, 42 and 44, respectively, and the feedback filter functions 20, 22, 24 (FIG. 1) are implemented as weights 46, 48, 50 connected to the DAC 26. The weights are represented by the Greek letters α,β and γ may be implemented for a switched capacitor time-discrete loop filter as differently sized capacitors, with the weight a being the largest, or for a gm-C time-continuous loop filter as differently sized current sources.

FIG. 3 illustrates an embodiment of a receiver having a time-continuous Sigma-Delta modulator 10, the order of which can be switched from a higher order, lower bandwidth configuration which is suitable for filtering GSM signals to a lower order, higher bandwidth configuration which is suitable for filtering IS95 signals.

The receiver comprises an antenna 52 connected to a RF front end stage 54 to which a local oscillator 55 is connected and used to frequency down-convert a received signal to an IF signal. The IF signal is filtered in a bandpass filter 56, the output from which is applied to an input 34 of the Sigma-Delta modulator 10.

The modulator 10 is essentially the same as shown and described with reference to FIG. 2 except for the following differences. The input 34 is connected to a change-over switch 58 having a first pole 60 connected to an input of a first summation stage 28 and a second pole 62 connected to an input of a second summation stage 30. Another switch 64 couples the first integrating stage 40 to an input of the second summation stage 30. A controller 66 controls the operation of the switches 58 and 64 so that when the switch 58 is connected to the pole 60, the switch 64 is conductive and the modulator 10 is configured as a 3rd order device but when the switch 58 is connected to the pole 62, the switch 64 is non-conductive and the modulator 10 is configured as a 2nd order device.

The controller 66 is also coupled to the integrator 40 and the weight 46 in order to power down or otherwise de-activate them when the input 34 is connected to the summation stage 30. A source 68 of sampling frequency Fs is coupled to the ADC 18 and the DAC 26. The source 68 can switch between a low and high sampling frequencies in response to signals from the controller 66.

The operation of the modulator 10 is based on the product of dynamic range and bandwidth being appropriate for the particular specifications the receiver has to adhere to.

Since the first stage of the modulator 10 has the greatest impact on the noise floor, it is better to omit the first summation stage 28 and the integrator 40 because when using a lower order modulator the quantisation noise is higher and a greater amount of electronic noise can be tolerated.

The weight 46 having the scaling coefficient a generally comprises a capacitor which has the highest capacitance value of the weights and for a certain charging current, is slower to charge compared to the other capacitors. Thus by by-passing the first stage of the modulator, the feedback current can charge quicker the smaller capacitors constituting the weights 48, 50 thus enabling the lower order variant of the modulator 10 to have a higher bandwidth.

Optionally control signals from the controller 66 can be applied to other parts of the modulator 10 to optimise its characteristics when operating at a lower order.

If it is desired that the modulator be implemented for time discrete operation then a sampling switch 36 shown in broken lines can be coupled between the output of the bandpass filter 54 and the signal input 34. The sampling switch 36 is operated at the current sampling frequency Fs.

FIG. 4 illustrates a second embodiment of a receiver and in the interests of brevity only the differences between this embodiment and the first embodiment shown in FIG. 3 will be described.

In FIG. 4, the signal input 34 is connected to the first summation stage 28. The connection between the output of the second summation stage 30 and the input to the integrator 42 comprises a change-over switch 70 having a first pole 72 connected to the output of the first summation stage 28 and a second pole 74 connected to the output of the second summation stage 30. The controller 66 controls the operation of the switch 70 such that when operating as a higher order modulator, the switch 70 is connected to the pole 74 but when operating as a lower order modulator, the switch 70 is connected to the pole 72. In this configuration the integrator 40 is disconnected and can be powered down but the weight 46 is coupled to the integrator 42.

As it is desired to run the lower order modulator at a higher sampling rate Fs, only the second and subsequent integrators 42, 44 need to have their bandwidths changed. For a time-discrete implementation having the sampling switch 36, this means that the low-noise, high power first integrator, that is the integrator 42 with the weight 46, does not need a fast settling time although the other integrators do.

In the case of a $g_m$-C time continuous implementation not having a sampling switch 36, the details are more complicated since the signals tend to be represented by currents rather than voltages. Care is needed to scale the input current to the second integration capacitor if the same signal handling is wanted. The drive currents can be kept the same and the bandwidth is changed by relying on the fact that the capacitance of the second integrator 42 is smaller.

A beneficial effect of reducing the order for higher bandwidth operation is that the stability of the modulator 10 is increased. As a consequence a resonator 76 shown in broken lines in FIG. 3 may be connected between the output of the last integrator 44 and an input to the summation stage 30. The resonator 76 widens the bandwidth of the noise shaping which increases the useable bandwidth as quantisation noise is moved to a higher frequency.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the field of Sigma-Delta modulators and component parts thereof and which may be used instead of or in addition to features already described herein.

What is claimed is:

1. A Sigma-Delta modulator comprising a signal input, a plurality of N integrating stages, where N is an integer of at least 2, a corresponding plurality of summing stages coupled to an input of a respective one of the integrating stages, an output of the first to the (N−1)th summing stages being coupled to an input of the second to the Nth integrating stage, respectively, an analogue to digital converter(ADC) having an input coupled to an output of the Nth integrating stage and an output, a feedback coupling from the ADC to a digital to analogue converter(DAC) which is coupled to an input of each of the summing stages, means for sampling the ADC and DAC, and control means for changing the order of the modulator, said control means comprising means for disconnecting the first of the integrating stages and using the second of the integrating stages as a first of the integrating stages.

2. A modulator as claimed in claim 1, characterised in that the integrating stages have different dynamic ranges with the first stage having the largest dynamic range.

3. A modulator as claimed in claim 1, characterised in that the integrating stages comprise capacitances and in that the first stage has the largest capacitance value.

4. A modulator as claimed in claim 1, characterised in that the output from the DAC to each of the summing stages comprises means for providing different scaling coefficients.

5. A modulator as claimed in any one of claim 1, characterised in that the control means reduces the order of the modulator by disconnecting the first integrating stage from the second summing stage and connecting the signal input to the second summing stage.

6. A modulator as claimed in any one of claim 1, characterised in that the control means reduces the order of the modulator by switching the signal input to the second integrating stage to the output of the first summing stage.

7. An integrated circuit comprising a Sigma-Delta modulator as claimed in any one of claim 1.

8. A receiver comprising means for frequency down converting an input signal to an IF signal, bandpass filtering means and a Sigma-Delta modulator comprising a signal input, a plurality of N integrating stages, where N is an integer of at least 2, a corresponding plurality of summing stages coupled to an input of a respective one of the integrating stages, an output of the first to the (N−1)th summing stages being coupled to an input of the second to the Nth integrating stage, respectively, an analogue to digital converter(ADC) having an input coupled to an output of the Nth integrating stage and an output, a feedback coupling from the ADC to a digital to analogue converter(DAC) which is coupled to an input of each of the summing stages, means for sampling the ADC and DAC, and control means for changing the order of the modulator, said control means comprising means for disconnecting the first of the integrating stages and using the second of the integrating stages as a first of the integrating stages.

9. A receiver as claimed in claim 8, characterised in that the control means reduces the order of the modulator by disconnecting the first integrating stage from the second summing stage and connecting the signal input to the second summing stage.

10. A receiver as claimed in claim 8, characterised in that the control means reduces the order of the modulator by switching the signal input to the second integrating stage to the output of the first summing stage.

* * * * *